(12) United States Patent
Kobayashi et al.

(10) Patent No.: US 7,943,483 B2
(45) Date of Patent: May 17, 2011

(54) METHOD OF MANUFACTURING SEMICONDUCTOR DEVICE

(75) Inventors: Akiko Kobayashi, Mie (JP); Shinya Kawamoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 12/557,981

(22) Filed: Sep. 11, 2009

(65) Prior Publication Data

US 2010/0221890 A1    Sep. 2, 2010

(30) Foreign Application Priority Data

Mar. 2, 2009   (JP) .................................. 2009-047917

(51) Int. Cl.
   *H01L 21/76* (2006.01)
(52) U.S. Cl. .. 438/427; 438/424; 438/257; 257/E21.422
(58) Field of Classification Search .................. 438/427, 438/424, 405, 257, 258, 259
   See application file for complete search history.

(56) References Cited

U.S. PATENT DOCUMENTS

| 7,265,022 B2 | 9/2007 | Ito et al. | |
|---|---|---|---|
| 7,279,394 B2 * | 10/2007 | Lee | 438/424 |
| 7,314,826 B2 | 1/2008 | Matsumoto | |
| 2006/0019446 A1 * | 1/2006 | Yang | 438/257 |

FOREIGN PATENT DOCUMENTS

| JP | 2004-228557 | 8/2004 |
|---|---|---|
| JP | 2006-32549 | 2/2006 |

* cited by examiner

*Primary Examiner* — Charles Garber
*Assistant Examiner* — Reema Patel
(74) *Attorney, Agent, or Firm* — Oblon, Spivak, McClelland, Maier & Neustadt, L.L.P.

(57) ABSTRACT

In forming an element isolation trench, an insulating film formed above a semiconductor substrate is etched such that relatively thin insulating film situated in the memory cell region is fully removed whereas relatively thick insulating film situated in the peripheral circuit region is etched so as to leave a remainder insulating film. Then, using the remainder insulating film in the peripheral circuit region as an etch stopper, the semiconductor substrate is etched, whereafter the remainder insulating film in the peripheral circuit region is fully removed to subsequently etch the semiconductor substrate.

20 Claims, 17 Drawing Sheets

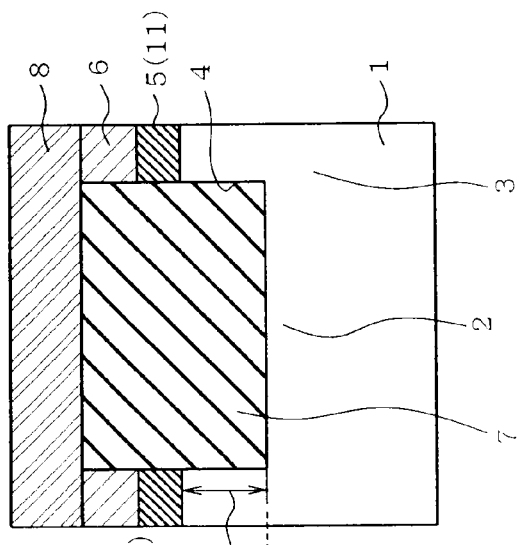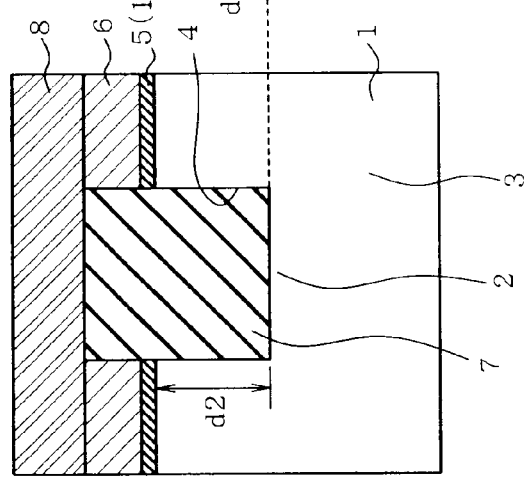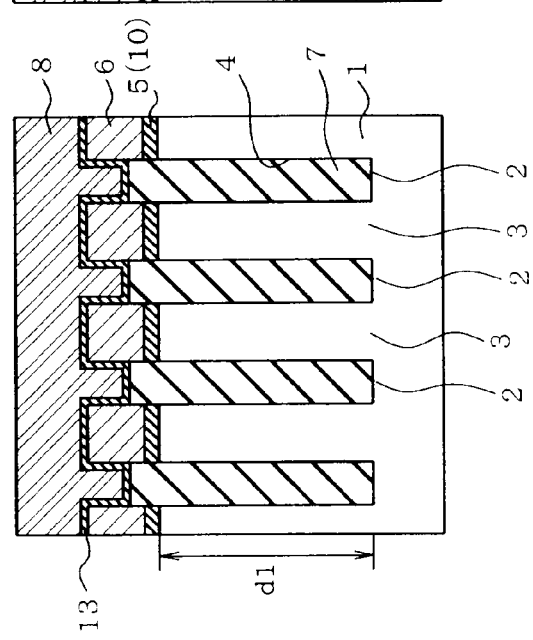

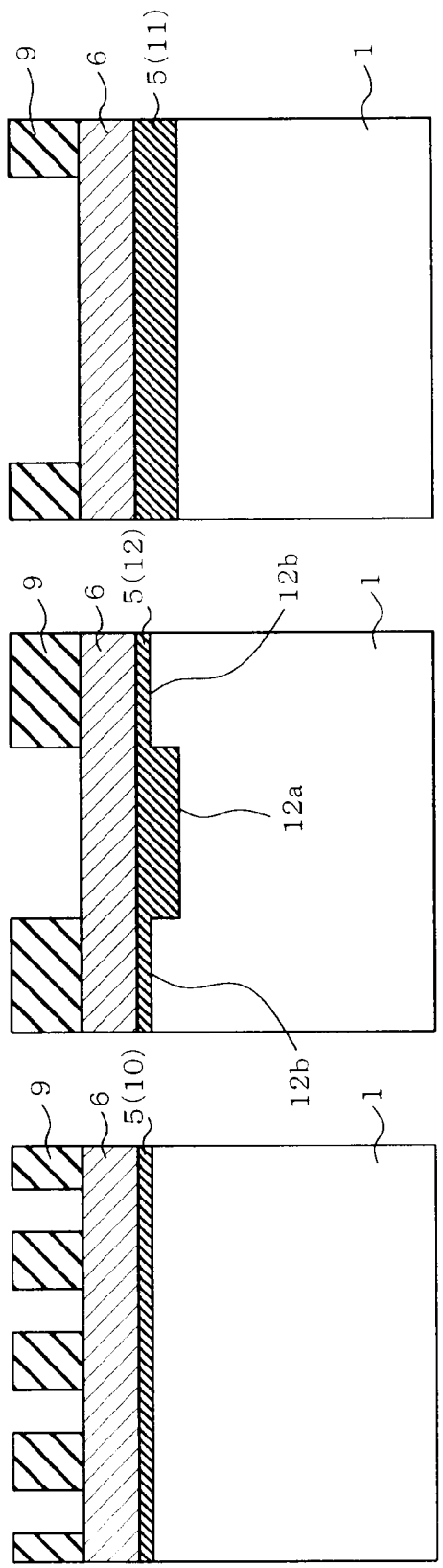

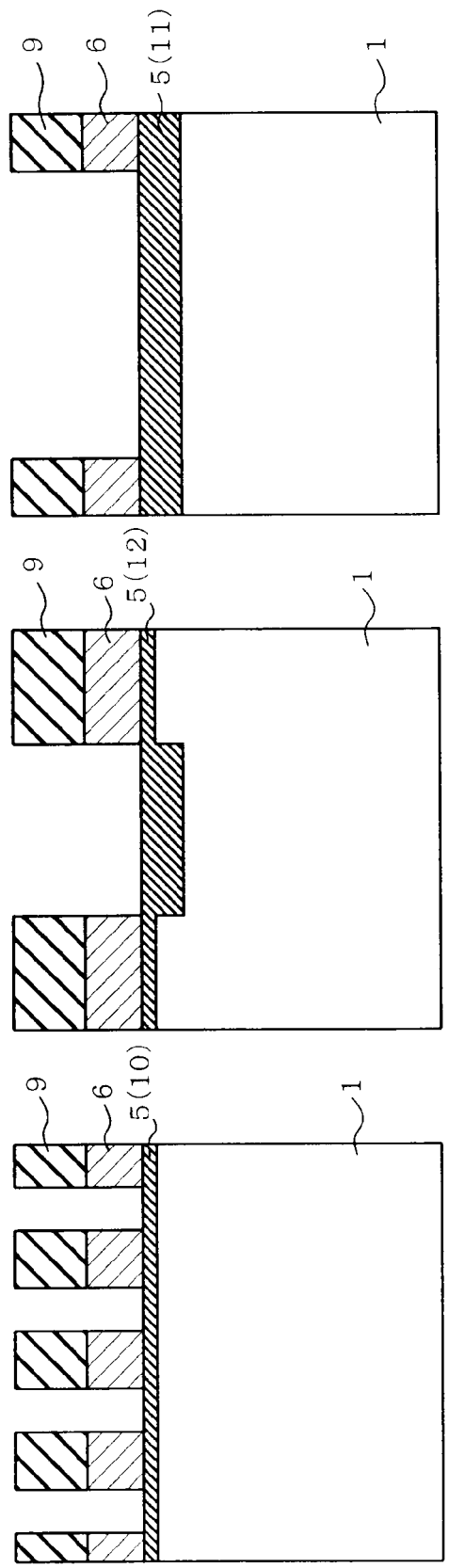

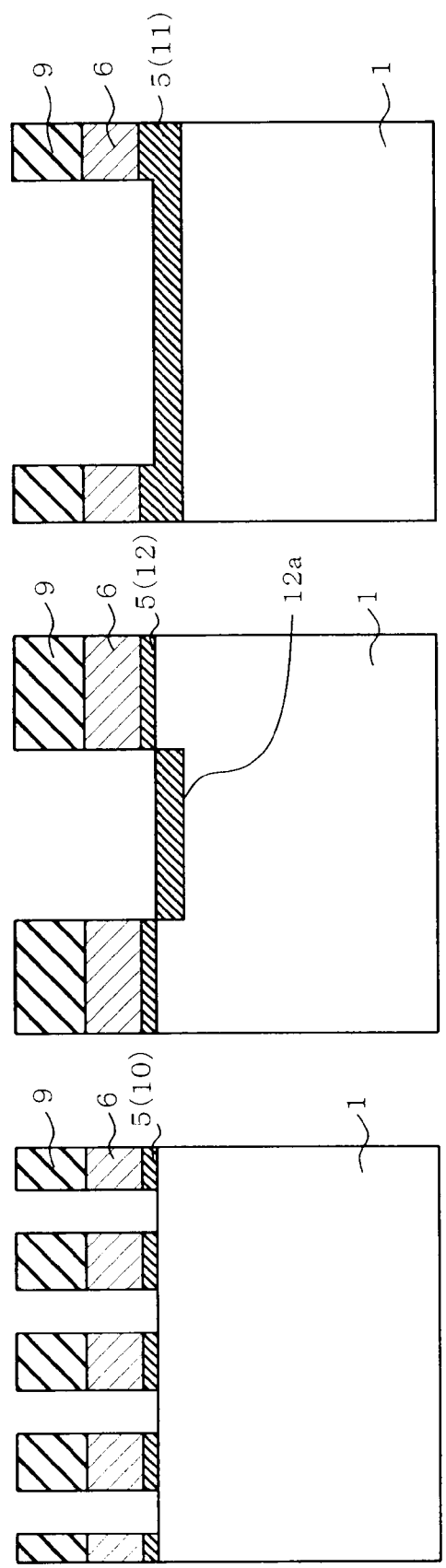

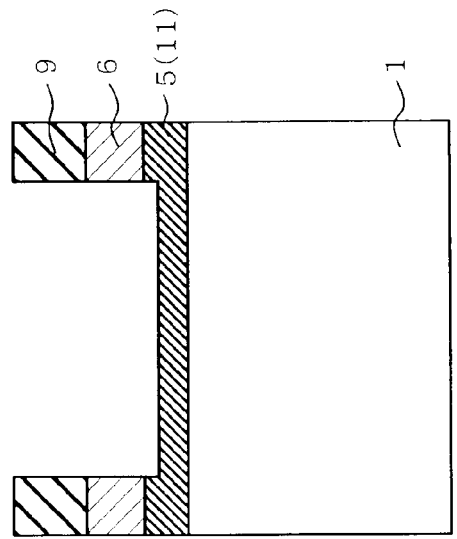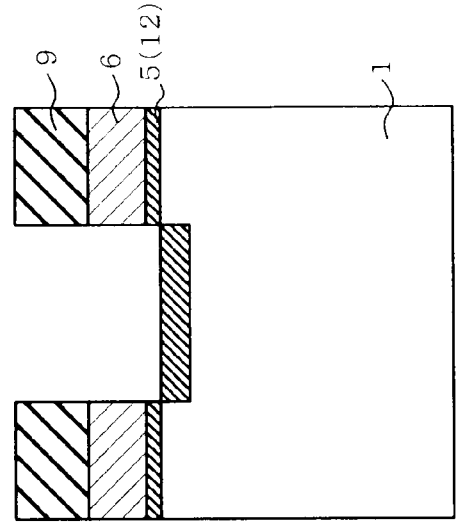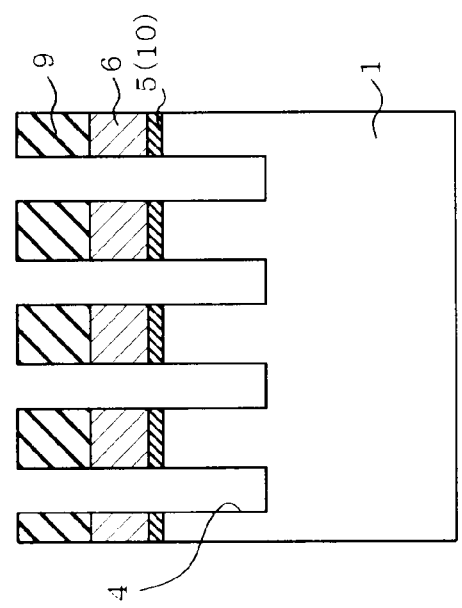

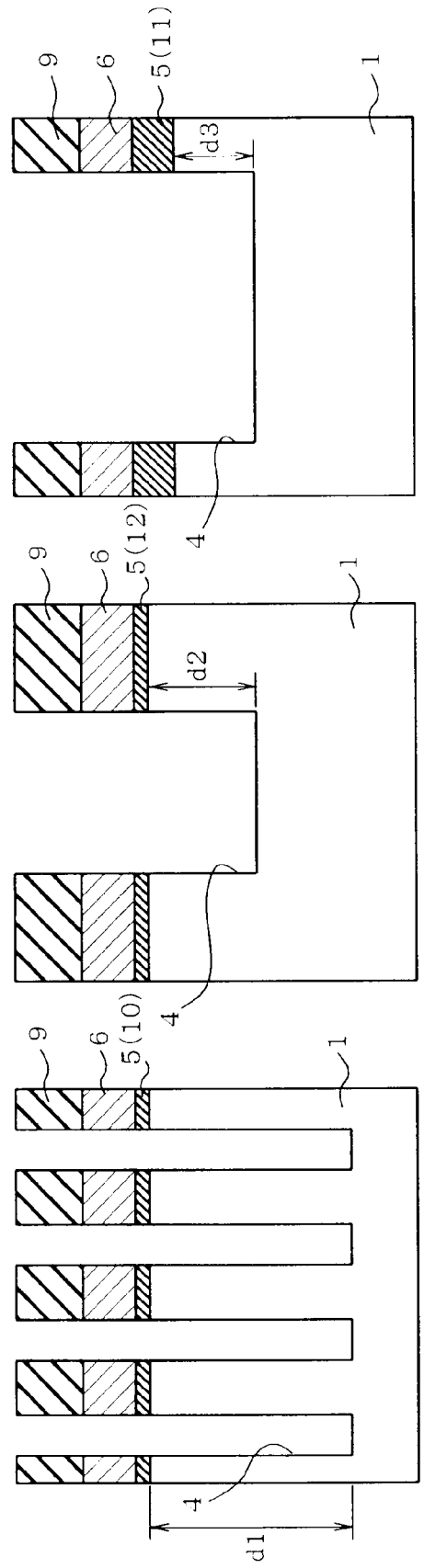

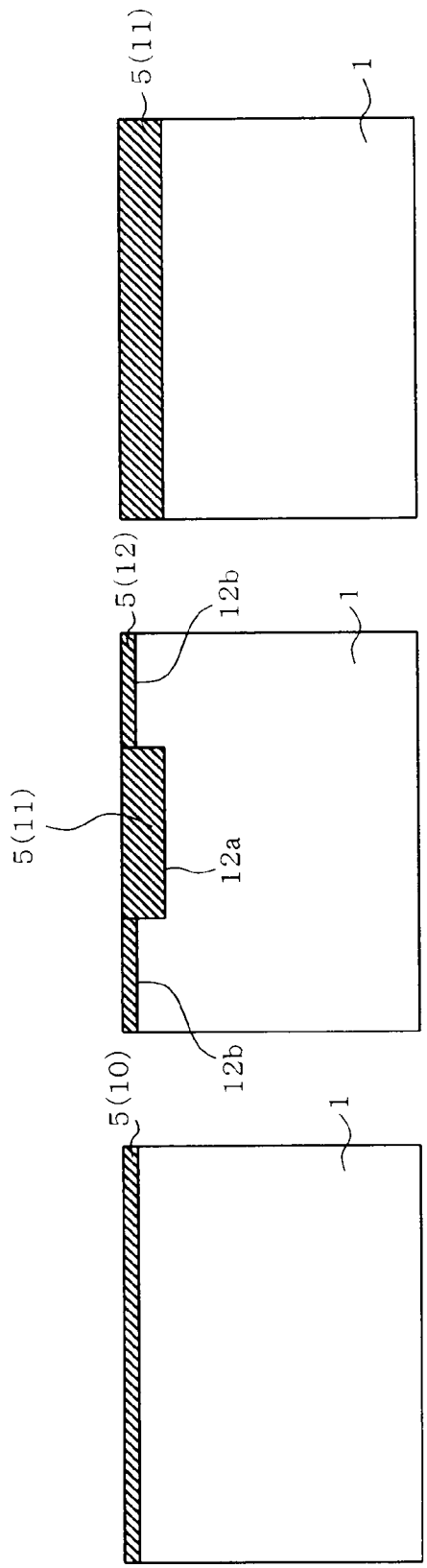

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2009-47917, filed on, Mar. 2, 2009, the entire contents of which are incorporated herein by reference.

FIELD

The present disclosure relates to a semiconductor device in which active areas are isolated by element isolation region and a method of manufacturing such semiconductor device.

BACKGROUND

A semiconductor device, typically a NAND flash memory provided with a multiplicity of memory cells are configured by memory cell transistors and peripheral circuit transistors formed on active areas isolated by element isolation regions such as an STI (Shallow Trench Isolation). In the memory cell region where the memory cells are formed, the element isolation region is configured in relatively narrower width, whereas in the peripheral circuit region where the peripheral transistors are formed, the element isolation region is configured in relatively wider width.

In order to form the above configured element isolation region, first, a resist is coated, exposed to light, and developed on the silicon substrate. Then, element isolation trenches are defined by dry etch using a silicon nitride film, or the like, as a mask. The dry etch, typically RIE (Reactive Ion Etching), etches a floating gate, a silicon oxide film (referred to as a tunnel insulating film in the memory cell region and a gate insulating film in the peripheral circuit region), and the silicon substrate in the listed sequence. Then, insulating film such as silicon oxide film is filled in the element isolation trench.

When dry etching the silicon substrate, relatively less amount of silicon is etched in the memory cell region since the opening of the element isolation trenches are narrower in the memory cell region, whereas in the peripheral circuit region, greater amount of silicon is etched since the opening of the element isolation trenches are wider in the peripheral circuit region, thus, resulting in greater tendency of the element isolation trenches in the peripheral circuit region being deeper than those in the memory cell region.

Device integration requires deeper element isolation trenches in the memory cell region to obtain sufficient element isolation, and this results in increasingly deeper element isolation trenches in the peripheral circuit region. When element isolation insulating film comprising silicon oxide film is filled in such element isolation trenches in the memory cell region and the peripheral circuit region, the silicon oxide film filled in the peripheral circuit region becomes greater in volume because of the above described difference in the trench configuration. Especially when employing hard coated polysilazane film as the silicon oxide film, the sizable volume required in the peripheral circuit region caused cracks in the silicon substrate by the stress produced when the polysilazane film is hardened. Such cracks lead to problems such as increase in junction leak current.

When forming a high-concentration impurity region taking an LDD (Lightly Doped Drain) structure in the semiconductor substrate, increased instances of linear defects such as dislocation primarily originating from crystal defects are observed at the depth of pn junction formed by ion implantation, in other words, at the depth where the impurity concentration is at its peak. This leads to further increase in junction leak current. Related field of technology is discussed in publications such as JP 2006-32549 A and JP 2004-228557 A.

SUMMARY

According to an aspect of the invention, there is provided a method of manufacturing a semiconductor device including preparing a semiconductor substrate including a memory cell region having a memory cell transistor and a peripheral circuit region having a high voltage transistor; forming a first insulating film above the semiconductor substrate situated in the memory cell region and a second insulating film thicker than the first insulating film above the semiconductor substrate situated in the peripheral circuit region; forming a polysilicon film on the first and the second insulating films; forming a silicon nitride film on the polysilicon film; forming a mask pattern on the silicon nitride film for defining a plurality of openings for forming element isolation trenches in the memory cell region and the peripheral circuit region; removing the polysilicon film according to the mask pattern to expose the first and the second insulating films; completely removing the exposed first insulating film in the memory cell region to expose the semiconductor substrate and partially removing the exposed second insulating film in the peripheral circuit region such that a predetermined thickness of the exposed second insulating film remains unremoved; etching the exposed semiconductor substrate in the memory cell region to form a trench having a first depth; removing the remaining second insulating film in the peripheral circuit region to expose the semiconductor substrate; simultaneously etching the exposed semiconductor substrate in the peripheral circuit region and the trench formed in the memory cell region to form a first element isolation trench having a second depth greater than the first depth in the memory cell region and a second element isolation trench having a third depth less than the second depth in the peripheral circuit region; and filling an element isolation insulating film in the first and the second element isolation trenches.

According to an aspect of the invention, there is provided a method of manufacturing a semiconductor device including preparing a semiconductor substrate including a memory cell region having a memory cell transistor, a first peripheral circuit region having a low voltage transistor, a second peripheral circuit region having a high voltage transistor; forming a first insulating film above the semiconductor substrate situated in the memory cell region and above the semiconductor substrate situated in a portion of the first peripheral circuit region where a gate electrode of the low voltage transistor is formed, and forming a second insulating film thicker than the first insulating film above a portion of the semiconductor substrate in the first peripheral circuit region where an element isolation trench is ultimately formed and above the semiconductor substrate situated in the second peripheral circuit region; forming a first polysilicon film on the first and the second insulating films; forming a silicon nitride film on the first polysilicon film; forming a mask pattern on the silicon nitride film for defining a plurality of openings for forming element isolation trenches in the memory cell region, the first peripheral circuit region and the second peripheral circuit region; removing the first polysilicon film according to the mask pattern to expose the first and the second insulating films; completely removing the first insulating film in the memory cell region to expose the semiconductor substrate and partially removing the second insulating film in the first and the second peripheral circuit regions such that a predetermined thickness of the exposed second insulating film remains unremoved; etching the exposed semiconductor substrate in the memory cell region to define a trench having a first depth; removing the remaining second insulating film in the first and the second peripheral circuit regions to expose the semiconductor substrate; simultaneously etching the exposed semiconductor substrate in the first and the second peripheral circuit regions and the trench formed in the memory cell region to form a first element isolation trench having a second depth greater than the first depth in the memory cell region and a second element isolation trench having a third depth less than the second depth in the first peripheral circuit region, and a third element isolation trench having a fourth depth less than the second depth in the second peripheral circuit region; and filling an element isolation insulating film in the first, second, and the third element isolation trenches.

BRIEF DESCRIPTION OF THE DRAWINGS

FIG. 3A is a cross sectional view, taken along line 3A-3A of FIG. 2, schematically depicting one phase of the manufacturing steps;

FIG. 3B is a cross sectional view schematically depicting one phase of the manufacturing step of a first peripheral circuit region;

FIG. 3C is a cross sectional view schematically depicting one phase of the manufacturing step of a second peripheral circuit region;

FIGS. 4A to 4C are cross sectional views schematically depicting one phase of the manufacturing steps;

FIGS. 5A to 5C are cross sectional views schematically depicting one phase of the manufacturing steps;

FIGS. 6A to 6C are cross sectional views schematically depicting one phase of the manufacturing steps;

FIGS. 7A to 7C are cross sectional views schematically depicting one phase of the manufacturing steps;

FIGS. 8A to 8C are cross sectional views schematically depicting one phase of the manufacturing steps;

FIGS. 15A to 15C are cross sectional views schematically depicting one phase of the manufacturing steps;

DETAILED DESCRIPTION

A first exemplary embodiment applying the present invention to a NAND flash memory will be described with reference to FIGS. 1 to 15. When relating to the figures in the following descriptions, identical or similar elements are identified with identical or similar reference symbols. Of note is that figures are schematic and do not reflect the actual relation between, for example, the thickness and the planar dimensions of the features and the ratio of thickness between each layer.

First, a description will be given on the configuration of the NAND flash memory according to the first exemplary embodiment.

Figure 1:
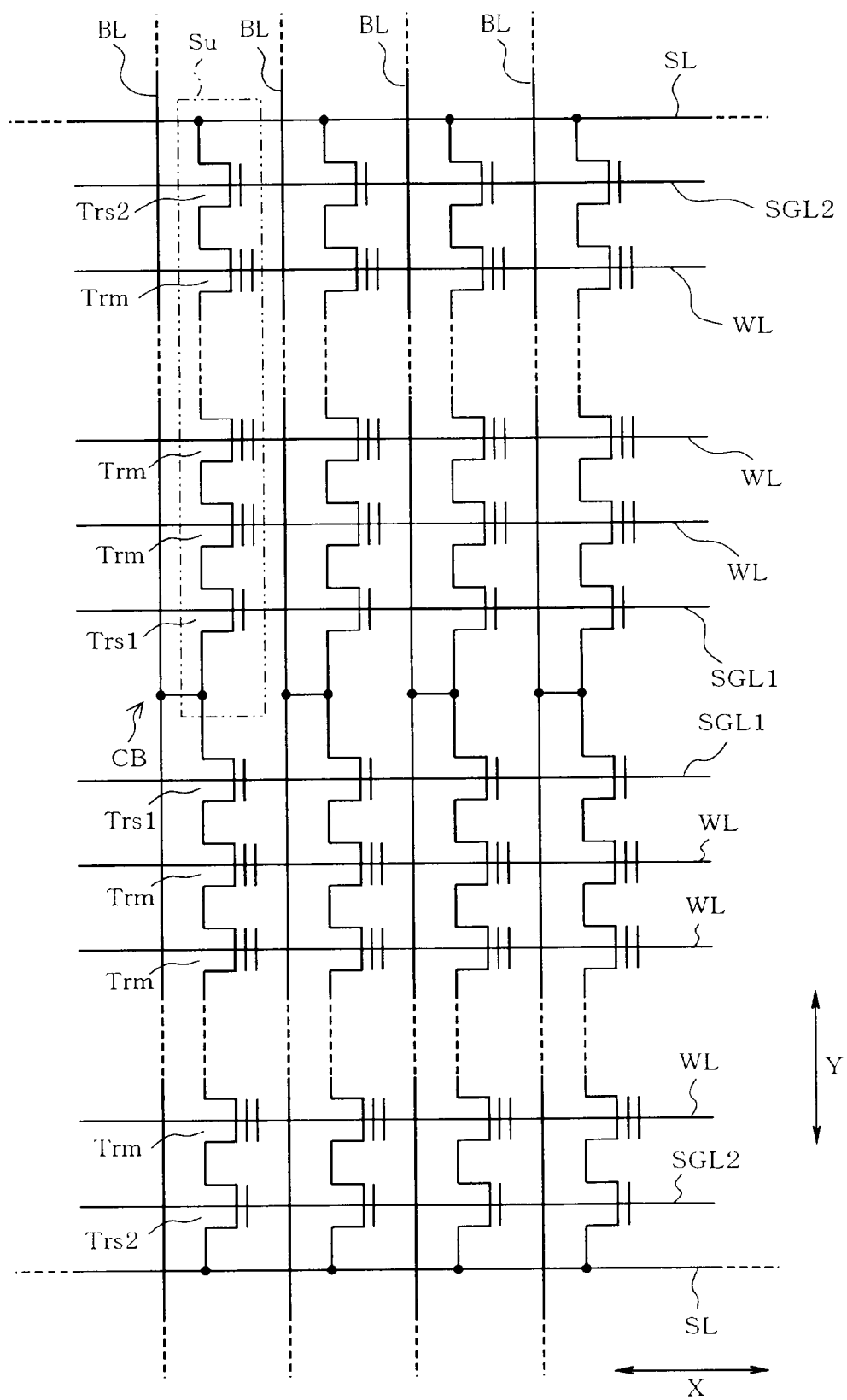
FIG. 1 depicts an equivalent circuit of a portion of a memory cell region according to a first exemplary embodiment of the present invention.

FIG. 1 is an equivalent circuit of a portion of a memory cell array formed in a memory cell region formed in the NAND flash memory.

NAND flash memory includes a memory cell array configured by multiplicity (32, for example) of matrix aligned NAND cell units SU. NAND Cell unit SU is configured by a couple of select gate transistors Trs and a plurality (32, for example) of memory cell transistors Trm series connected between the couple of select gate transistors Trs. Neighboring memory cell transistors Trm within NAND cell unit SU share a common source/drain region.

Referring to FIG. 1, memory cell transistors Trm aligned in an X-direction (corresponding to word line direction and gate width direction) are connected to a common word line (control gate line) WL. Similarly, select gate transistors Trs1 aligned in the X-direction in FIG. 1 are connected to a common select gate line SGL1. Select gate transistors Trs2 are connected to a common select gate line SGL2. A bit line contact CB is connected to a drain region of select gate transistor Trs1. Bit line contact CB is connected to a bit line BL extending in the Y-direction (corresponding to the gate length direction and the bit line direction) orthogonal to the X-direction indicated in FIG. 1. Select gate transistor Trs2 is connected to a source line SL extending in the X-direction as viewed in FIG. 1 via the source region.

Figure 2:
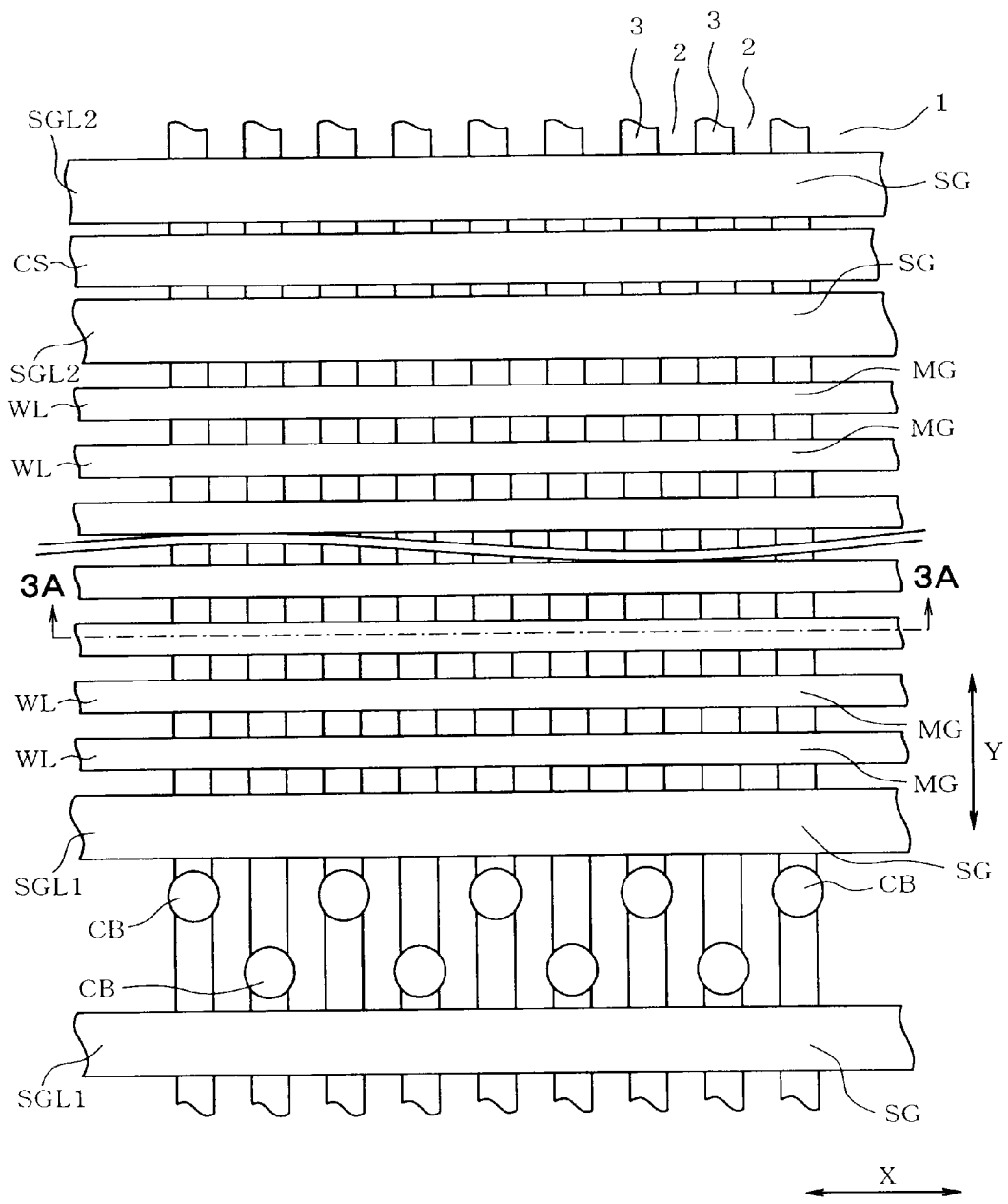
FIG. 2 is a schematic plan view of a portion of the memory cell region.

FIG. 2 is a plan view indicating a layout of a portion of the memory cell. A plurality of STIs 2 (shallow trench isolation) serving as an element isolation region is formed at a predetermined interval along the Y-direction as viewed in FIG. 2 to form active areas 3 isolated in the X-direction as viewed in FIG. 2. Word lines WL of memory cell transistors are formed at predetermined intervals along the X-direction as viewed in FIG. 2 so as to be orthogonal to active area 3. Word lines WL and active area 3 define a matrix containing a plurality of NAND columns comprising a set of thirty two word lines WL.

At both ends of each NAND column, a pair of select gate lines SGL1 and a pair of select gate lines SGL2 are formed that are connected to select gate transistors Trs. Select gate line SGL1 resides on the drain side whereas select gate line SGL2 resides on the source side. On each active area 3 situated between the pair of select gate lines SGL1, a bit line contact CB is formed respectively. The holes of the neighboring bit line contacts CB are displaced from the other in the bit line direction to collectively exhibit a zigzag layout as can be seen in FIG. 2.

On each active area 3 situated between the pair of select gate lines SGL2, source line contact CS is formed. Source line contact CS differs in layout from bit line contact CB in that it is a line pattern extending in the word line direction having a single linear groove defined on it.

The source and drain are inversed every other NAND column so that bit line contact CB and source line contact CS can be shared between NAND columns neighboring in the bit line direction. The above described layout is repeated to define the cell array. At the intersection of active area 3 and word line WL, a gate electrode MG of memory cell transistor Trm is formed, whereas at the intersection of active area 3 and select gate lines SGL1 and SGL2, a gate electrode SG of select gate transistor Trs is formed.

FIGS. 3A to 3C are schematic cross sectional views depicting one phase of the manufacturing process of the above described NAND flash memory. FIG. 3A is a cross sectional view of the memory cell region taken along line 3A-3A of FIG. 2, in other words, a cross sectional view taken along word line WL. FIG. 3B is a cross sectional view of a first peripheral circuit region where low-level voltage transistors are formed and FIG. 3C is a cross sectional view of a second peripheral circuit region where a high-level voltage transistors are formed.

On a silicon substrate 1 shown in FIGS. 3A, 3B, and 3C, a trench 4 serving as an element isolation trench is defined for forming an STI 2 between active areas 3. Depth d1 of trenches 4 formed in the memory cell region (first element isolation trench) measured from the upper surface of silicon substrate 1 is controlled at a sufficient depth to prevent write errors between the neighboring cells. Depth d2 of trenches 4 formed in the first peripheral circuit region (second element isolation trench) measured from the upper surface of silicon substrate 1 is controlled at a depth to prevent stress being produced by a silicon oxide film 7 filled in trench 4. Further, depth 3 of trenches 4 formed in the second peripheral circuit region (third element isolation trench) measured from the upper surface of silicon substrate 1 is also controlled at a depth to prevent stress being produced by a silicon oxide film 7 filled in trench 4 but shallower in depth compared depth d2 (d3<d2). The depths of the bottom surfaces of trench 4 of the first and second peripheral circuit regions are equal when measured from the upper surface of the silicon substrate 1 of the first peripheral circuit region.

Referring to FIG. 3A, above the upper surface of silicon substrate 1 of active area 3 in the memory cell region, a silicon oxide film 5, a polysilicon film 6, an interelectrode insulating film 13, and a polysilicon film 8 are laminated in listed sequence. Silicon oxide layer 5 constitutes a tunnel insulating film 10 of the memory cell transistor. Polysilicon film 6 constitutes a floating gate electrode. Interelectrode insulating film 13 comprises a high-dielectric film such as an ONO (silicon oxide-silicon nitride-silicon oxide) film and alumina (Al$_2$O$_3$). Polysilicon film 8 constitutes a control gate electrode.

Interelectrode insulating film 13 is formed along the upper surface and the side surface of polysilicon film 6 to extend over the upper surface of silicon oxide film 7 in continuation with the interelectrode insulating film 13 formed on the neighboring polysilicon film 6. Polysilicon film 8 is formed along interelectrode insulating film 13 and interconnected by extending over silicon oxide film 7 to constitute a word line (WL) that extends in the left and right direction as viewed in FIG. 3A.

Referring now to FIG. 3B, above the upper surface of silicon substrate 1 of active area 3 in the first peripheral circuit region, silicon oxide film 5, polysilicon film 6, and polysilicon film 8 are laminated in listed sequence. Silicon oxide film 5 constitutes a gate insulating film 12 of a low voltage transistor, whereas polysilicon film 6 constitutes a lower gate electrode of the low voltage transistor and polysilicon film 8 constitutes an upper gate electrode of the low voltage transistor.

Referring further to FIG. 3C, above the upper surface of silicon substrate 1 of active area 3 in the second peripheral circuit region, silicon oxide film 5, polysilicon film 6, and polysilicon film 8 are laminated in listed sequence. Silicon oxide film 5 constitutes a gate insulating film 11 of a high voltage transistor, whereas polysilicon film 6 constitutes a lower gate electrode of the high voltage transistor and polysilicon film 8 constitutes an upper gate electrode of the high voltage transistor. Polysilicon film 8 shown in FIGS. 3B and 3C is interconnected by extending over silicon oxide film 7 and oriented in the left and right direction as viewed in FIGS. 3B and 3C, respectively.

Trenches 4 are each filled with silicon oxide film 7 comprising a hard spin coated polysilazane film serving as an element isolation insulating film to define STI 2 serving as an element isolation region. As can be seen in FIG. 3A, the upper portion of silicon oxide film 7 protrudes above the surface of silicon substrate 1 but below the upper surface of polysilicon film 6. In the features shown in FIGS. 3B and 3C, the upper surface of silicon oxide film 7 is at level with the upper surface of the polysilicon film 6.

The manufacturing process flow for forming STI 2 in the NAND flash memory will now be described with reference to FIGS. 4A to 8C. The leftmost FIGS. 4A, 5A, 6A, 7A, and 8A of FIGS. 4 to 8 correspond to FIG. 3A, the middle FIGS. 4B, 5B, 6B, 7B, and 8B correspond to FIG. 3B, and the rightmost FIGS. 4C, 5C, 6C, 7C, and 8C correspond to FIG. 3C.

As the first step of the manufacturing process, silicon substrate 1 situated in the memory cell region, the first peripheral circuit region and the second peripheral circuit region are thermally oxidized to form a silicon oxide film 5 as shown in FIGS. 4A to 4C. Then, polysilicon film 6 and silicon nitride film 9 are formed in listed sequence over silicon oxide film 5. Silicon oxide film 5 constitutes tunnel insulating film 10, gate insulating film 11, and gate insulating film 12 as earlier described. Silicon nitride film 9 serves as a hardmask for use in the subsequent steps. Then openings are defined on silicon nitride film 9 to form STI 2 in each of the memory cell region and the first and the second peripheral circuit region by photolithography and dry etch such as RIE (Reactive Ion Etching).

Silicon oxide film 5 situated in the memory cell region is formed as a thin tunnel insulating film 10 as can be seen in FIG. 4A. Silicon oxide film 5 situated in the second peripheral circuit region, on the other hand, serves as a gate insulating film 11 which is greater in thickness compared to the tunnel insulating film 10 as can be seen in FIG. 4C. As shown in FIG. 4B, silicon oxide film 5 situated in the first peripheral circuit region is configured such that the thickness at portion 12a where STI 2 is ultimately formed is controlled at a thickness substantially equal to the thickness of gate insulating film 11 formed in the second peripheral circuit region, whereas the thickness of silicon oxide film 5 at portion 12b below polysilicon film 6 constituting the gate electrode of the low voltage transistor is controlled at a thickness substantially equal to the thickness of tunnel insulating film 10 of the memory cell region. The method for forming gate insulating film 12 (silicon oxide film 5) of varying thickness in the first peripheral circuit region will be later described.

Then, as shown in FIGS. 5A to 5C, using silicon nitride film 9 as a mask, polysilicon film 6 is dry etched until silicon oxide film 5 is exposed to form a plurality of floating gate electrodes, the lower gate electrodes of high voltage transistors, and the lower gate electrodes of the low voltage transistors.

Then, as shown in FIG. 6A, silicon oxide film 5 (tunnel insulating film 10) exposed by dry etching in the memory cell region is fully etched away by further dry etch. The exposed silicon oxide film 5 (gate insulating film 11, gate insulating film 12) in the peripheral circuit regions having greater thickness compared to that in the memory cell region is controlled in its duration of etch time so that a predetermined thickness of silicon oxide film 5 remains unetched.

Then, the exposed silicon substrate 1 in the memory cell region is dry etched with greater selectivity relative to silicon oxide film. Thus, trench 4 having a predetermined thickness less than depth d1 is defined on silicon substrate 1 situated in the memory cell region as can be seen in FIG. 7A. In the first and the second peripheral circuit regions, on the other hand, the remaining silicon oxide film 5 serves as an etch stopper to prevent etching of silicon substrate 1 as can be seen in FIGS. 7B and 7C.

Thereafter, the remaining silicon oxide film 5 in the first and the second peripheral circuit regions are fully etched away to expose silicon substrate 1. Then, as shown in FIGS. 8A to 8B, the trenches defined in the memory cell region and silicon substrate 1 situated in the first and the second peripheral circuit regions are etched simultaneously. The simultaneous etch forms a first element isolation trench 4 of depth d1 in the memory cell region, a second element isolation trench 4 of depth d2 in the second peripheral circuit region and a third element isolation trench 4 of depth 3 in the second peripheral circuit region as shown in FIGS. 3A to 3C.

Then a spin-on-glass polysilazane is coated over the memory cell region, and the first and the second peripheral circuit region to fill trench 4. The spin coated polysilazane film is thereafter hardened to be transformed to silicon oxide film 7.

The manufacturing process flow for silicon oxide film 5 (gate insulating film 12) of the first peripheral circuit region shown in FIG. 4B will be described with reference to FIGS. 9 to 15.

Figure 9A:
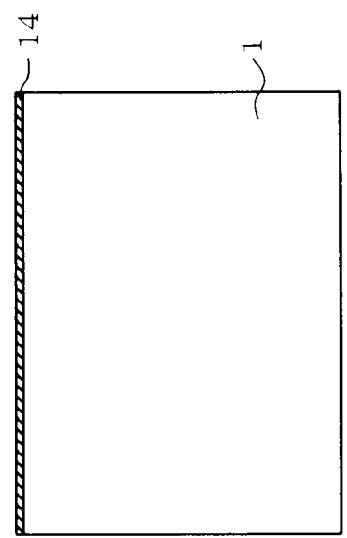
FIGS. 9A to 9C are cross sectional views schematically depicting one phase of the manufacturing steps in forming a silicon oxide film on a silicon substrate.
Figure 9B:
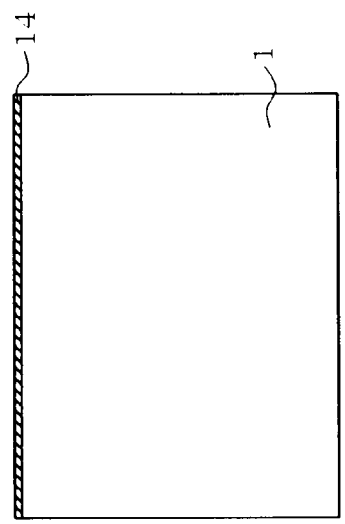
Figure 9C:
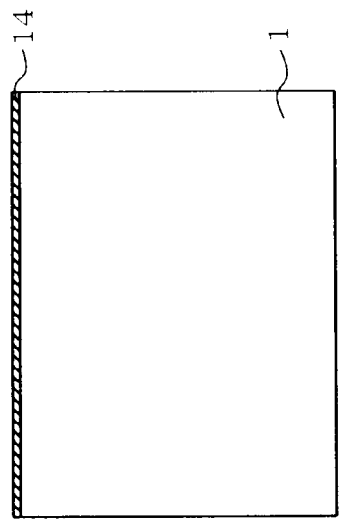

As the first step of the process flow, a sacrificial film 14 comprising a silicon nitride film, for example, is formed on silicon substrate 1 situated in the memory cell region and the first and the second peripheral circuit regions are formed as shown in FIGS. 9A to 9C.

Figure 10C:
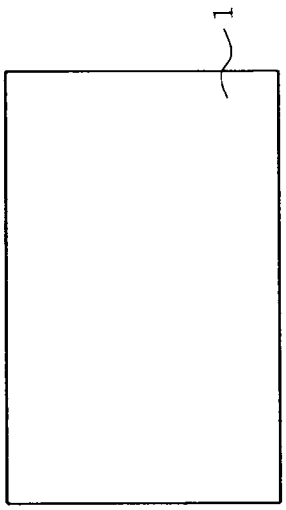
FIGS. 10A to 10C are cross sectional views schematically depicting one phase of the manufacturing steps.
Figure 10B:
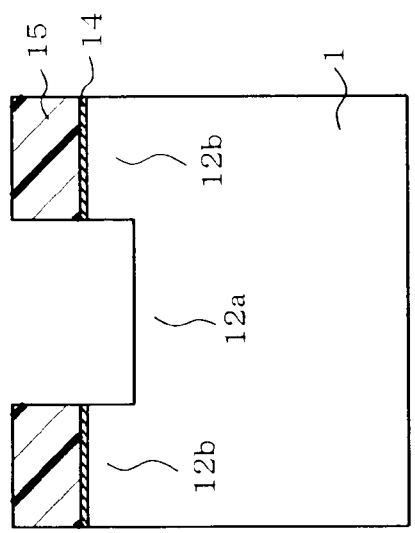
Figure 10A:
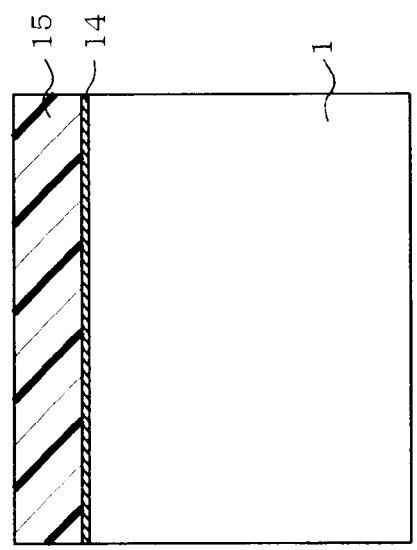

Then, a mask 15 comprising a resist film is formed on sacrificial film 14 residing in the memory cell region and sacrificial film 14 residing in portion 12b of the first peripheral circuit region which is an area exclusive of portion 12a where STI 2 is ultimately firmed. Then, as shown in FIGS. 10B and 10C, using mask 15, sacrficial film 14 residing in portion 12a of the first peripheral circuit region and sacrificial film 14 residing in the second peripheral circuit region uncovered by mask 15 is fully removed by hot phosphoric acid. Then the exposed silicon substrate 1 is etched by RIE to a predetermined depth. Thereafter, mask 15 formed in the memory cell region and the first peripheral circuit region are removed.

Figures 11A, 11B, 11C:
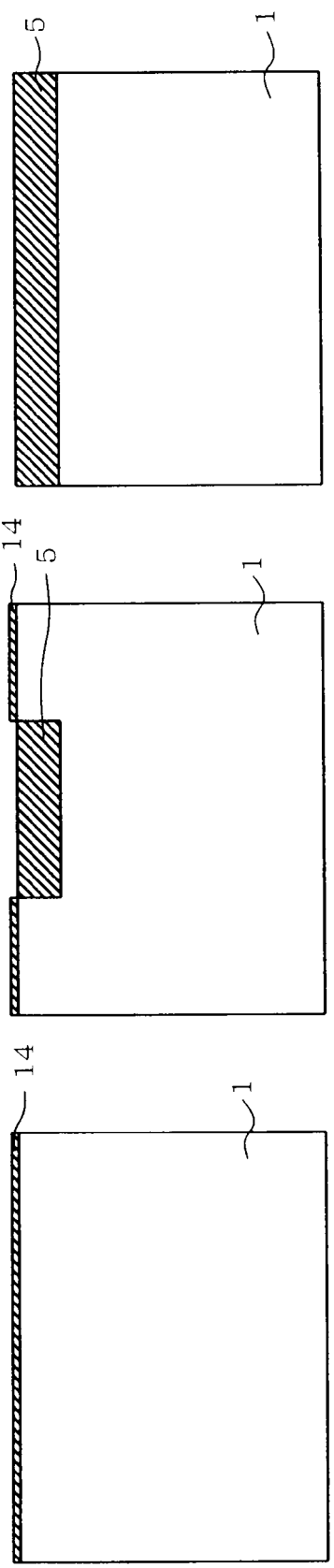
FIGS. 11A to 11C are cross sectional views schematically depicting one phase of the manufacturing steps.

Then, as shown in FIGS. 11B to 11C, silicon oxide film 5 constituting gate insulating film 11 for high voltage transistors is formed by thermal oxidation on the etched silicon substrate 1 situated in portion 12a of the first peripheral circuit region and in the second peripheral circuit region in its entirety.

Figure 12C:
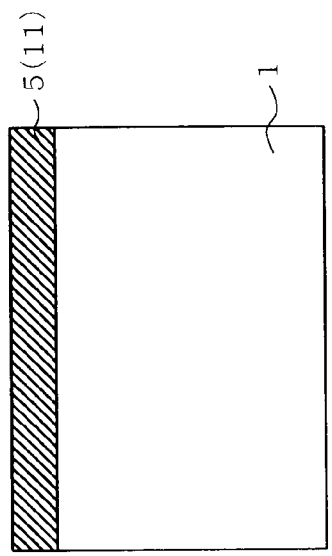
FIGS. 12A to 12C are cross sectional views schematically depicting one phase of the manufacturing steps.
Figure 12B:
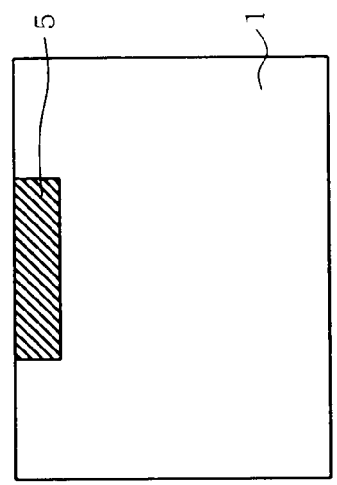
Figure 12A:
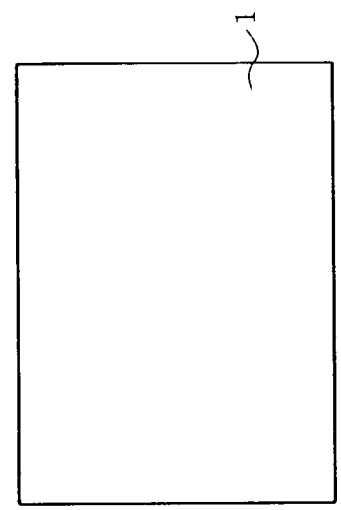

Then, as shown in FIGS. 12A and 12B, sacrificial film 14 formed in the memory cell region and the first peripheral circuit region is removed.

Figure 13C:
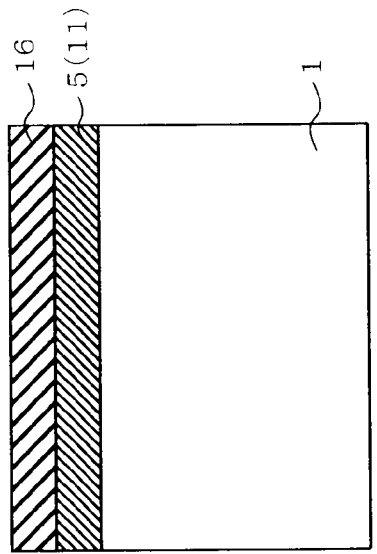
FIGS. 13A to 13C are cross sectional views schematically depicting one phase of the manufacturing steps.
Figure 13B:
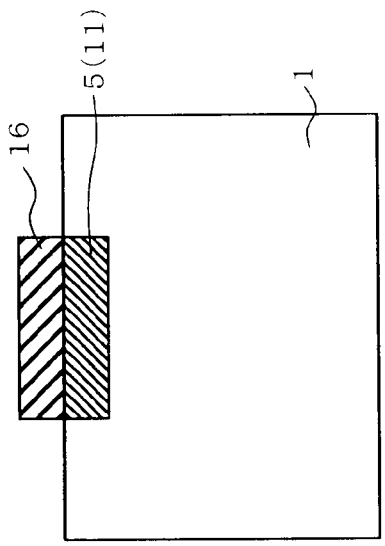
Figure 13A:
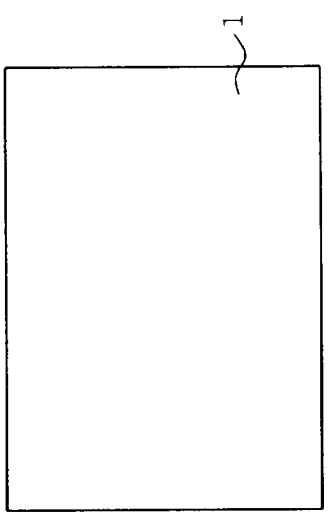

Then, as shown in FIGS. 13B and 13C, a mask 16 comprising a silicon nitride film, for example, is formed on silicon oxide film 5 formed in portion 12a of the first peripheral circuit region and silicon oxide film 5 formed entirely across the high voltage transistor region.

Figure 14A:
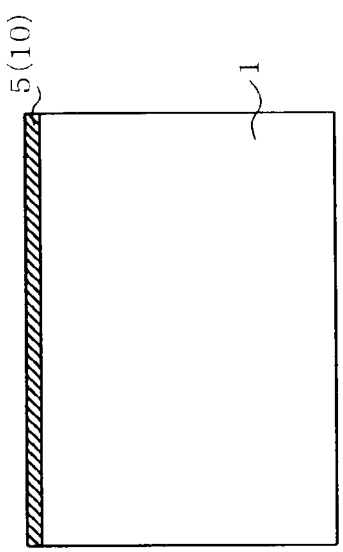
FIGS. 14A to 14C are cross sectional views schematically depicting one phase of the manufacturing steps.
Figure 14B:
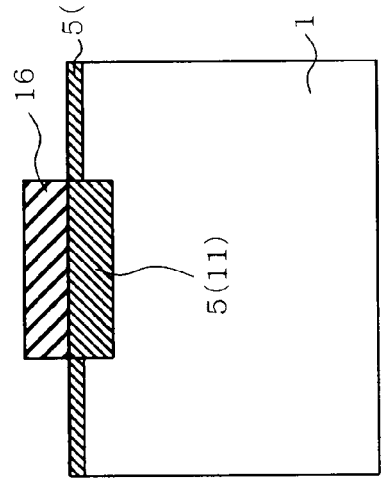
Figure 14C:
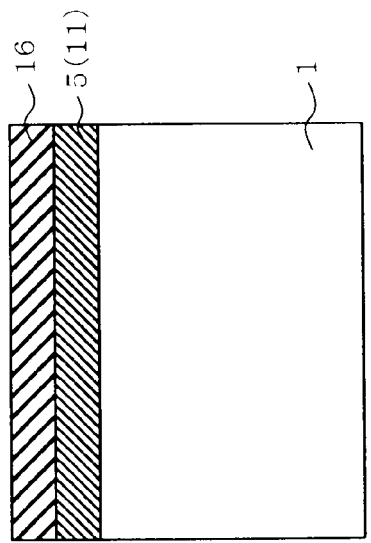

Then, as shown in FIGS. 14A and 14B, silicon oxide film 5 constituting tunnel insulating film 10 for memory cell transistors and gate insulating film 12 for low voltage transistors is formed by thermal oxidation on the surface of silicon substrate 1 situated in the memory cell region and the first peripheral circuit region, respectively.

Then, as shown in FIGS. 15 and 15C, mask 16 provided in the first and the second peripheral circuit region is removed. Thus, the first peripheral circuit region is configured to have portion 12a having a silicon oxide film 5 being identical in thickness to gate insulating film 11 for high voltage transistors residing in the second peripheral circuit region, and portion 12b having a silicon oxide film 5 being identical in thickness to tunnel insulating film 10 for memory cell transistors residing in the memory cell region.

According to the above described first exemplary embodiment, depth of trenches 4 formed in STI 2 of the first and the second peripheral circuit regions can be controlled at sufficient but limited depths d2 and d3 respectively while providing sufficient depth d1 for trenches 4 formed in STI 2 of the memory cell region. The above configuration allows the volume of silicon oxide film 7 filled in trenches 4 of the first and the second peripheral circuit regions to be restrained to prevent stress from being exerted on silicon oxide film 7 and thereby preventing cracks being formed in silicon substrate 1 situated in the first and the second peripheral regions which in turn prevents junction leaks.

Figure 16B:
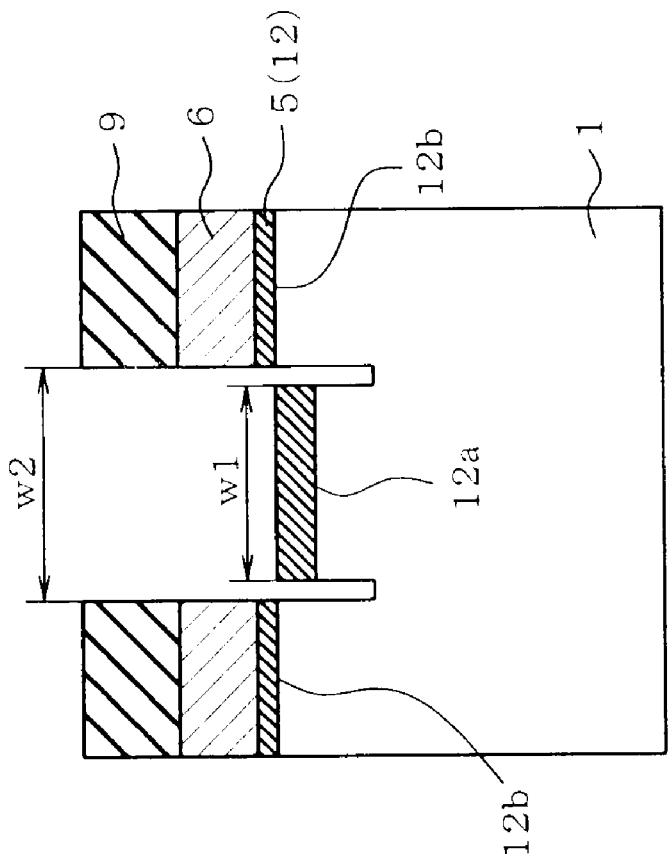
FIGS. 16A and 16B correspond to FIGS. 7A and 7B and describe a second exemplary embodiment of the present invention.
Figure 16A:
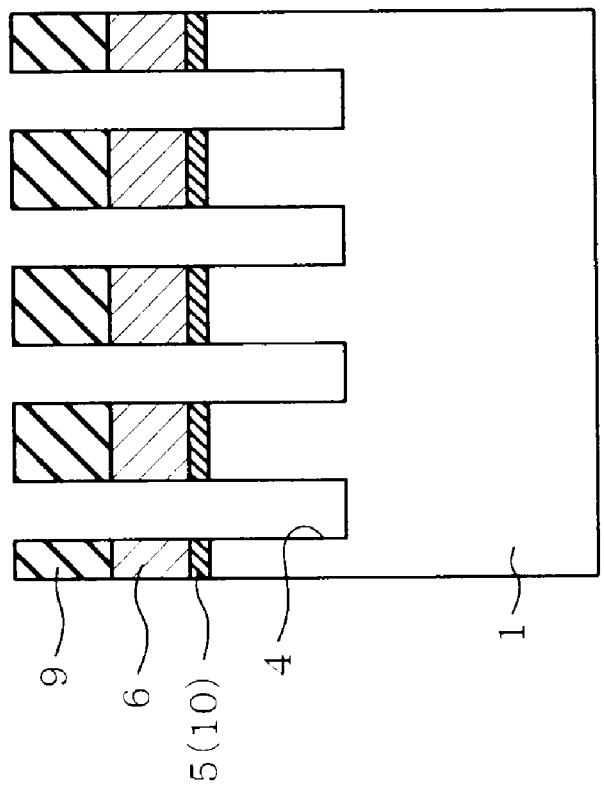
Figure 17A:
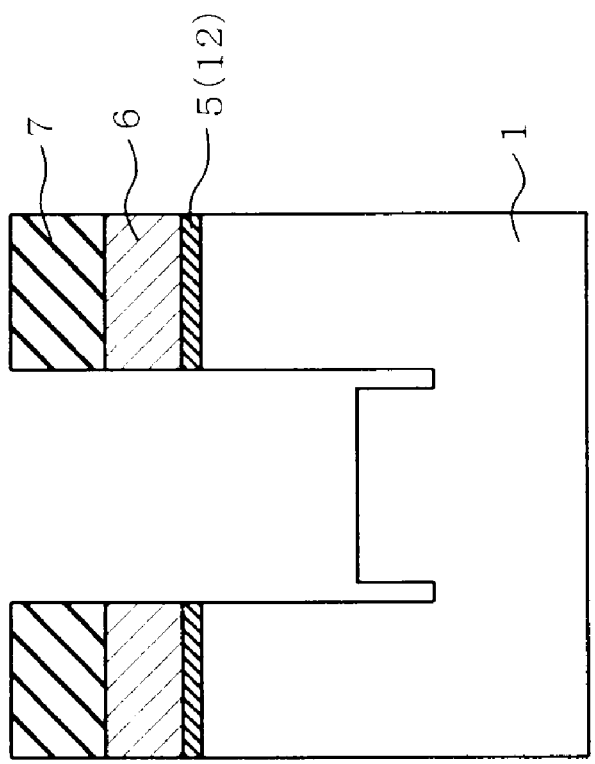
FIGS. 17A and 17B correspond to FIGS. 8A and 8B.
Figure 17B:
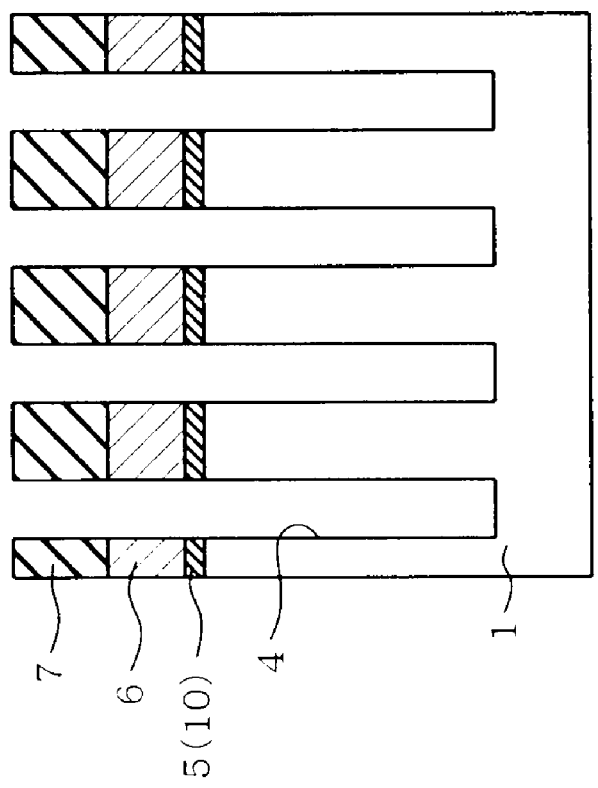

FIGS. 16 and 17 depict a second exemplary embodiment of the present invention. Elements that are identical to the first exemplary embodiment are identified with identical reference symbols. FIGS. 16A, 16B, 17A, and 17B correspond to FIGS. 7A, 7B, 8A, and 8B respectively. The second exemplary embodiment describes a case where portion 12a of silicon oxide film 5 (gate insulating film 12), residing in the first peripheral region, is misaligned with trench 4 formed in STI 2 during the lithography process. As described earlier, silicon oxide film 5 (gate insulating film 12) residing in portion 12a of the first peripheral circuit region has relatively increased thickness which is as thick as gate insulating film 11 of the second peripheral circuit region.

Misalignments, if any, are controlled so that portion 12a of silicon oxide film 5 (gate insulating film 12) residing in the first peripheral circuit region is always configured at a width w1 shown in FIG. 16B which is less than a width w2 of trench 4 formed in STI 2 shown in FIG. 16B and portion 12a resides within trench 4 formed in the STI 2. This arrangement is intended to prevent misalignment in which width of portion 12a is greater than the width of trench 4 formed in STI 2, stated differently, either or both of the ends of portion 12a resides outside trench 4 formed in STI 2 which is just the opposite of the misalignments described earlier. Such misalignment, described in detail afterwards, needs to be eliminated because it impairs the properties of the low voltage transistors residing in the first peripheral circuit region.

When silicon oxide film 5 is dry etched with the above described misalignment in photolithography as shown in FIG. 16B and, a predetermined thickness of silicon oxide film 5 remains unetched in portion 12a of silicon oxide film 5 having relatively greater thickness in the first peripheral circuit region. However, portion 12b of silicon oxide film 5 at both ends of portion 12a, being relatively less in thickness, is etched away to expose silicon substrate 1. Thus, subsequent dry etching of silicon substrate 1 forms narrow trenches in the silicon substrate situated at both ends of the remaining silicon oxide film 5, in other words, portion 12a as can be seen in FIG. 16B.

Thereafter, silicon oxide film 5 (12a and 11) remaining in the first and the second peripheral circuit regions is fully etched away to expose silicon substrate 1. Then, silicon substrate 1 situated in the memory cell region and the first and the second peripheral circuit regions is etched simultaneously. Thus, first element isolation trench 4 having depth d1 is formed in the memory cell region, a second element isolation trench 4 having depth d2 is formed in the first peripheral circuit region, and a third element isolation trench 4 having depth d3 is formed in the second peripheral circuit region to exhibit a feature shown in FIGS. 17A and 17B. As can be seen in FIG. 17B, thin trenches are formed at both ends of the bottom of trenches 4 formed in the first peripheral circuit region. Even if trenches 4 in the first peripheral circuit region under such state are filled with silicon oxide film 7, the volume of silicon oxide film 7 does not substantially differ from the first exemplary embodiment. Thus, stress can be suppressed at silicon oxide film 7 to prevent cracks being formed in silicon substrate 1 situated in the first peripheral circuit region. Hence, the features according to the above described configuration are not affected by misalignment in photolithography.

The present invention is not limited to the above described exemplary embodiments but may be expanded or modified as follows.

The interelectrode insulating film provided between the floating gate electrode and the control gate electrode may take various configurations such as a NONON (silicon nitride-silicon oxide-silicon nitride-silicon oxide-silicon nitride.) film structure. The present invention being applied to NAND flash memory having a floating gate electrode structure in the first and the second exemplary embodiments may be applied to NAND flash memory having a MONOS (Metal Oxide Nitride Oxide Semiconductor) gate structure.

The first and the second exemplary embodiments have employed relatively shallower element isolation trenches in both the peripheral circuit region having high voltage transistors and the peripheral circuit region having low voltage transistors. However, if only the suppression of leak current at pn junction of heavily doped impurity region of the high voltage transistors needs to be considered, only the peripheral circuit region having high voltage transistors may be configured to have element isolation trenches that are relatively shallower than element isolation trenches formed elsewhere.

The foregoing description and drawings are merely illustrative of the principles of the present invention and are not to be construed in a limited sense. Various changes and modifications will become apparent to those of ordinary skill in the art. All such changes and modifications are seen to fall within the scope of the disclosure as defined by the appended claims.

What is claimed is:

1. A method of manufacturing a semiconductor device, comprising:
   preparing a semiconductor substrate including a memory cell region having a memory cell transistor and a peripheral circuit region having a high voltage transistor;
   forming a first insulating film above the semiconductor substrate situated in the memory cell region and a second insulating film thicker than the first insulating film above the semiconductor substrate situated in the peripheral circuit region;
   forming a polysilicon film on the first and the second insulating films;
   forming a silicon nitride film on the polysilicon film;
   forming a mask pattern on the silicon nitride film for defining a plurality of openings for forming element isolation trenches in the memory cell region and the peripheral circuit region;
   removing the polysilicon film according to the mask pattern to expose the first and the second insulating films;
   completely removing the exposed first insulating film in the memory cell region to expose the semiconductor substrate and partially removing the exposed second insulating film in the peripheral circuit region such that a predetermined thickness of the exposed second insulating film remains unremoved;
   etching the exposed semiconductor substrate in the memory cell region to form a trench having a first depth;
   removing the remaining second insulating film in the peripheral circuit region to expose the semiconductor substrate;
   simultaneously etching the exposed semiconductor substrate in the peripheral circuit region and the trench formed in the memory cell region to form a first element isolation trench having a second depth greater than the first depth in the memory cell region and a second element isolation trench having a third depth less than the second depth in the peripheral circuit region; and
   filling an element isolation insulating film in the first and the second element isolation trenches.

2. The method according to claim 1, wherein the element isolation insulating film is a silicon oxide film comprising a hard polysilazane coated film.

3. The method according to claim 1, wherein the second insulating film is formed in a portion where the semiconductor substrate is lowered by a predetermined depth.

4. A method of manufacturing a semiconductor device comprising:
   preparing a semiconductor substrate including a memory cell region having a memory cell transistor, a first peripheral circuit region having a low voltage transistor, a second peripheral circuit region having a high voltage transistor;
   forming a first insulating film above the semiconductor substrate situated in the memory cell region and above the semiconductor substrate situated in a portion of the first peripheral circuit region where a gate electrode of the low voltage transistor is formed, and forming a second insulating film thicker than the first insulating film above a portion of the semiconductor substrate in the first peripheral circuit region where an element isolation trench is ultimately formed and above the semiconductor substrate situated in the second peripheral circuit region;
   forming a first polysilicon film on the first and the second insulating films;
   forming a silicon nitride film on the first polysilicon film;
   forming a mask pattern on the silicon nitride film for defining a plurality of openings for forming element isolation trenches in the memory cell region, the first peripheral circuit region and the second peripheral circuit region;
   removing the first polysilicon film according to the mask pattern to expose the first and the second insulating films;
   completely removing the first insulating film in the memory cell region to expose the semiconductor substrate and partially removing the second insulating film in the first and the second peripheral circuit regions such that a predetermined thickness of the exposed second insulating film remains unremoved;

etching the exposed semiconductor substrate in the memory cell region to define a trench having a first depth;

removing the remaining second insulating film in the first and the second peripheral circuit regions to expose the semiconductor substrate;

simultaneously etching the exposed semiconductor substrate in the first and the second peripheral circuit regions and the trench formed in the memory cell region to form a first element isolation trench having a second depth greater than the first depth in the memory cell region and a second element isolation trench having a third depth less than the second depth in the first peripheral circuit region, and a third element isolation trench having a fourth depth less than the second depth in the second peripheral circuit region; and filling an element isolation insulating film in the first, second, and the third element isolation trenches.

5. The method according to claim 4, wherein the element isolation insulating film is a silicon oxide film comprising a hard polysilazane coated film.

6. The method according to claim 4, wherein the second insulating film is formed in a portion where the semiconductor substrate is lowered by a predetermined depth.

7. The method according claim 4, wherein a depth of a bottom surface of the second element isolation trench measured from an interface between the first insulating film formed in the first peripheral circuit region and the semiconductor substrate is greater than a depth of a bottom surface of the third element isolation trench measured from an interface between the second insulating film formed in the second peripheral circuit region and the semiconductor substrate.

8. The method according to claim 4, wherein partially removing the exposed second insulating film in the first and the second peripheral circuit regions is carried out by etching with controlled etch time.

9. The method according to claim 5, wherein in the memory cell region, an upper portion of the silicon oxide film protrudes above an upper surface of the semiconductor substrate and an upper surface of the upper portion of the silicon oxide film is lower than an upper surface of the first polysilicon film.

10. The method according to claim 5, wherein in the first and the second peripheral circuit regions, an upper surface of the silicon oxide film is configured to be at level with an upper surface of the first polysilicon film.

11. The method according to claim 9, wherein in the memory cell region, an interelectrode insulating film is formed on the first polysilicon film and a second polysilicon film is formed on the interelectrode insulating film.

12. The method according to claim 10, wherein in the first and the second peripheral circuit regions, a second polysilicon film is formed on the first polysilicon insulating film.

13. The method according to claim 11, wherein the interelectrode insulating film comprises laminated layers of a first silicon oxide film, a silicon nitride film formed on the first silicon oxide film and a second silicon oxide film formed on the silicon nitride film; or an alumina film; or laminated layers of a first silicon nitride film, a first silicon oxide film formed on the first silicon nitride film, a second silicon nitride film formed on the first silicon oxide film, a second silicon oxide film formed on the second silicon nitride film, and a third silicon nitride film formed on the second silicon oxide film.

14. The method according to claim 4, wherein the semiconductor substrate comprises a silicon substrate, the first and the second insulating films comprise a silicon oxide film.

15. The method according to claim 14, wherein etching the exposed semiconductor substrate to the first depth is carried out by dry etching the silicon substrate with selectivity to silicon over silicon oxide film and by using the remaining second insulating film comprising the silicon oxide film as an etch stopper.

16. The method according to claim 14, wherein forming the silicon oxide film on the silicon substrate includes:

forming a sacrificial film on the silicon substrate;

forming a first mask on the sacrificial film in the memory cell region and on the sacrificial film over the first peripheral circuit region exclusive of a portion where an element isolation region is ultimately formed;

removing the sacrificial film in the first peripheral region according to the first mask, and the sacrificial film in the second peripheral region without the first mask to expose the semiconductor substrate, etching the exposed silicon substrate to a predetermined depth;

removing the first mask formed in the memory cell region and the first peripheral circuit region;

forming a first silicon oxide film serving as a gate insulating film of the high voltage transistor by thermal oxidation on a portion of the silicon substrate situated in the first peripheral circuit region which has been etched and on the silicon substrate situated in the second peripheral circuit region;

removing the sacrificial film formed in the memory cell region and the first peripheral circuit region;

forming a second mask on the first silicon oxide film formed on the first peripheral circuit region and on the second peripheral circuit region;

forming a second silicon oxide film serving as a tunnel insulating film of the memory cell transistor and a gate insulating film of the low voltage transistor by thermal oxidation above the silicon substrate situated in the memory cell region and the first peripheral circuit region which are not covered by the second mask; and removing the second mask in the first and the second peripheral circuit regions.

17. The method according to claim 4, wherein forming the mask pattern on the silicon nitride film to define openings to form the element isolation trenches is carried out by photolithography and dry etching the silicon nitride film.

18. The method according to claim 17, wherein the photolithography permits misalignment in which a width of the second insulating film in the first peripheral circuit region is narrower than a width of the element isolation trenches, and the second insulating film in the first peripheral circuit region is disposed within the element isolation trenches.

19. The method according to claim 4, wherein the semiconductor device is a NAND flash memory.

20. The method according to claim 19, wherein the NAND flash memory includes a metal oxide nitride oxide semiconductor gate structure.

* * * * *